United States Patent
Lee et al.

(10) Patent No.: US 7,095,670 B2
(45) Date of Patent: Aug. 22, 2006

(54) SEMICONDUCTOR MEMORY HAVING VARIABLE MEMORY SIZE AND METHOD FOR REFRESHING THE SAME

(75) Inventors: You-Mi Lee, Seoul (KR); Kyung-Woo Nam, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 33 days.

(21) Appl. No.: 10/928,191

(22) Filed: Aug. 30, 2004

(65) Prior Publication Data

US 2005/0152200 A1   Jul. 14, 2005

(30) Foreign Application Priority Data

Jan. 9, 2004   (KR) .................... 10-2004-0001617

(51) Int. Cl.
*G11C 7/00* (2006.01)

(52) U.S. Cl. .............. 365/222; 365/236; 365/239

(58) Field of Classification Search .............. 365/222, 365/236, 239, 230.09
See application file for complete search history.

(56) References Cited

U.S. PATENT DOCUMENTS

| | | | |
|---|---|---|---|
| 5,890,198 A * | 3/1999 | Pawlowski | 711/106 |
| 6,137,743 A * | 10/2000 | Kim | 365/222 |
| 6,570,801 B1 * | 5/2003 | Yoshida et al. | 365/222 |
| 6,754,126 B1 * | 6/2004 | Yamaguchi et al. | 365/222 |

FOREIGN PATENT DOCUMENTS

KR   100276386 B1   9/2000

* cited by examiner

*Primary Examiner*—Anh Phung
(74) *Attorney, Agent, or Firm*—Volentine Francos & Whitt, PLLC

(57) ABSTRACT

A semiconductor memory device is operable in a full capacity mode and at least one reduced capacity mode, and includes a memory array having a plurality of memory blocks, each of the memory blocks having at least one word line. An address generation circuit generates a first multi-bit address signal having a logic value which is sequentially incremented by one during each of successive refresh periods. An address sorting circuit receives the first multi-bit address signal and outputs a second multi-bit address signal in which one or more least significant bits of the first multi-bit address signal are arranged in the second multi-bit address signal to indicate a memory block of the memory array, and in which remaining bits of the first multi-bit address signal are arranged in the second multi-bit address to indicate a word line within the selected memory block. The word lines of the memory array are refreshed according to the second multi-bit address signal.

33 Claims, 13 Drawing Sheets

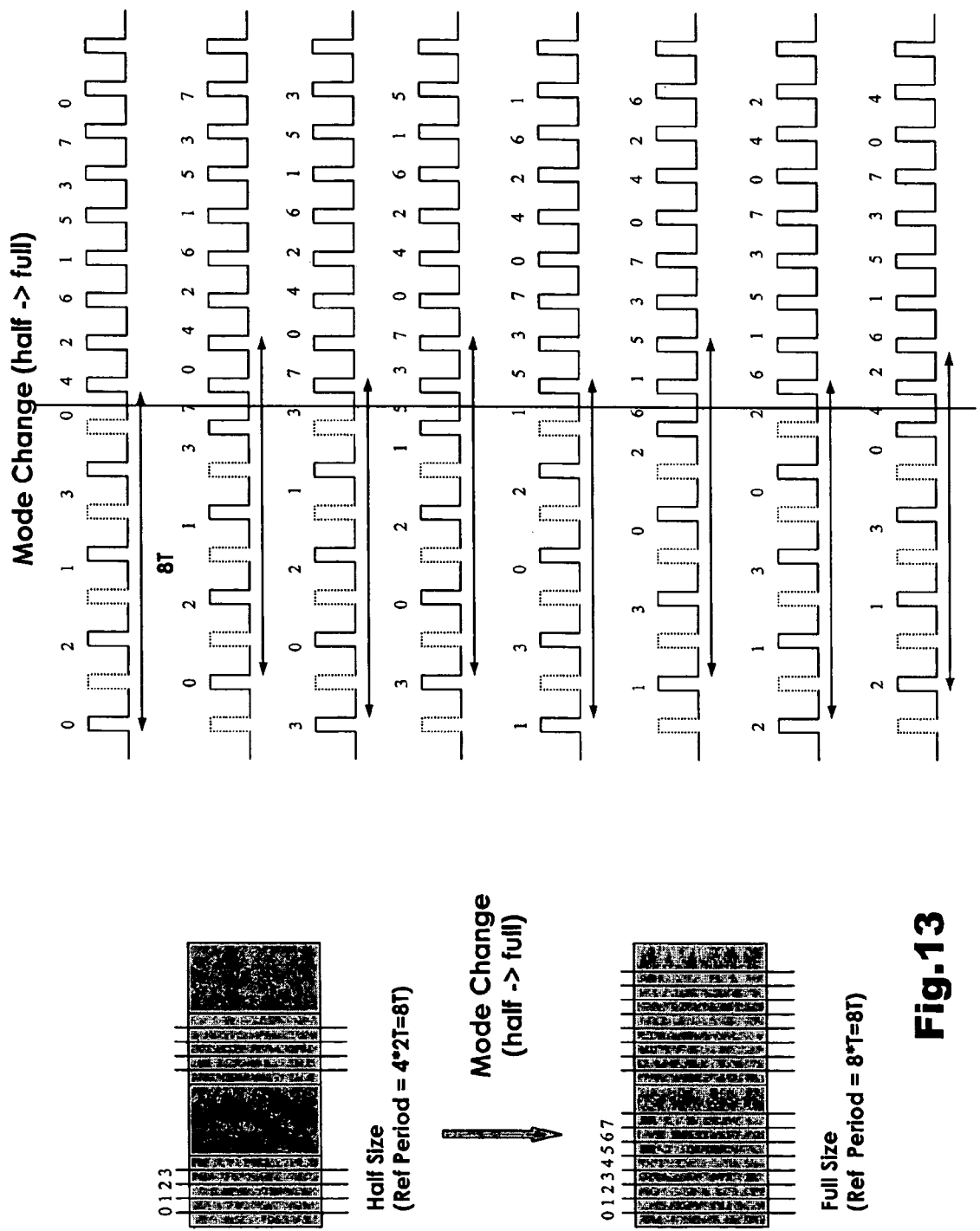

SEMICONDUCTOR MEMORY HAVING VARIABLE MEMORY SIZE AND METHOD FOR REFRESHING THE SAME

BACKGROUND OF THE INVENTION

1. Field of the Invention

The present invention generally relates to semiconductor memories and to methods of refreshing memory cells of semiconductor memories. More particularly, the present invention relates to semiconductor memories having variable memory sizes and to methods of refreshing memory cells of such memories.

2. Description of the Related Art

Variable sized semiconductor memory devices are known in which all or a subset of the memory blocks contained in the devices can be selectively utilized. One such memory device is the Uni-transistor RAM (UtRAM), also known as the Psuedo SRAM (PSRAM), which is configured of DRAM cells but has an SRAM interface. For example, a 16 mega-bit (16M) UtRAM operating in a full memory mode can function like a 16M SRAM, whereas the same 16M UtRAM operating in a half memory mode can function like an 8M SRAM.

Largely for cost reasons, it is sometimes preferable to implement an 8M SRAM using a 16M UtRAM operating in the half memory mode. Also, as already suggested, the UtRAM allows for flexibility in setting the memory size. Varying the size/capacity of the UtRAM is known as "reduced memory size mode" (RMS mode). The RMS mode can be established at any time during the operation of the memory device.

Since the UtRAM contains DRAM cells, the memory cells must be periodically refreshed to maintain the integrity of stored data. As is best explained by way of example, this refresh requirement creates a problem when the RMS mode is used. Assume that the UtRAM contains two memory blocks, where both memory blocks are used in a full memory mode, and only one memory block is used in a half memory mode. Assume further that four word lines (designated 0, 1, 2 and 3) are arranged in the first memory block, and four more word lines (designated 4, 5, 6 and 7) are arranged in the second memory block. In the refresh operation of the full memory mode, the word lines are sequentially selected in order (0 through 7). This is illustrated on the left side of the vertical line extending through the timing chart of FIG. 1. As shown in the first pulse waveform, the word lines are selected one-by-one in order (0, 1, 2, 3, 4, 5, 6, 7) during each of successive refresh periods T. The total design refresh cycle time is 8T.

Still referring to the top pulse waveform of FIG. 1, assume that the memory device changes to the half memory mode after the last word line (7) is selected during the refresh operation. As illustrated to the right of the vertical line, only half the word lines (0, 1, 2, 3) are selected one-by-one in order during the half memory mode. Note that each successive selection takes place at 2T intervals. This is because design restrictions mandate that the total refresh cycle time remain at 8T. A problem arises in this case because the effective refresh cycle time for the fourth word line (3) is 12T during the transition between memory modes. This exceeds the design refresh cycle time of 8T, meaning that data contained in the memory cells of the fourth word line can be lost.

The remaining pulse waveforms of FIG. 1 respectively represent the seven other possible instances in which the memory device can be switched to the half memory mode. As can be seen in the figure, there are multiple cases in which the effective refresh cycle time of a given word line exceeds the design refresh cycle time of 8T.

As shown in FIG. 2, this problem also arises when switching from the half memory mode to the full memory mode. For example, as illustrated by the top pulse waveform of FIG. 2, if the memory mode is switched from half to full after selecting the fourth word line (3), the effective refresh cycle time for the first word line (0) becomes 12T. Again, this exceeds the design refresh period of 8T.

SUMMARY OF THE INVENTION

According to a first aspect of the present invention, a memory device is provided which is operable in a full memory capacity mode and at least one reduced memory capacity mode. The memory device includes a memory array including a plurality of word lines, a refresh reference signal generator which generates a refresh reference signal pulse, and a row selection circuit, responsive to the refresh reference signal pulse, which non-sequentially selects the word lines during successive refresh operations in at least the full capacity mode.

According to another aspect of the present invention, a semiconductor memory device is provided which includes a memory array having a plurality of memory blocks, each of memory blocks having at least one word line, and a refresh circuit which is operable in a full memory mode and a reduced memory mode. The refresh circuit applies a refresh signal to the all of word lines during each of successive constant refresh cycle times in the full memory mode, and the refresh circuit applies the refresh signal to a subset of the word lines during each of the successive constant refresh cycle times in the reduce memory mode. During each transition from the full memory mode to the reduced memory mode, all of the subset of the word lines receive the refresh signal within the constant refresh cycle time.

According to yet another aspect of the present invention, a semiconductor memory device is provide which is operable in a full capacity mode and at least one reduced capacity mode. The memory device includes a memory array including a plurality of memory blocks, each of the memory blocks having at least one word line, and an address generation circuit which generates a first multi-bit address signal having a logic value which is sequentially incremented by one during each of successive refresh periods. The memory device further includes an address sorting circuit which receives the first multi-bit address signal and outputs a second multi-bit address signal in which one or more least significant bits of the first multi-bit address signal are arranged in the second multi-bit address signal to indicate a memory block of the memory array, and in which remaining bits of the first multi-bit address signal are arranged in the second multi-bit address to indicate a word line within the selected memory block. The memory device still further includes a row decoder which receives the second multi-bit address signal and which selects at least one word line according to the second multi-bit address during a refresh operation.

According to still another aspect of the present invention, a memory device is provided which is operable in a full memory capacity mode and N reduced memory capacity modes, where N is an integer of 1 or more. The memory device includes a memory array having m memory blocks each having at least one word line, where m is an integer of $2^N$ or more, and a refresh reference signal generator which generates a refresh reference signal pulse having a period T.

The memory device further includes an refresh address generation circuit which generates a first n-bit address signal having bits A0, A1, . . . An, wherein n is an integer greater than or equal to N, and wherein a logic value of the n-bit address signal is sequentially incremented by 1 at each period T of the refresh reference pulse signal. The memory device also includes a refresh controller which generates a refresh main signal according to a mode control signal and bits A0 . . . , A(N−1) of the first address signal, and an address converter which generates a second n-bit address signal having bits R0, R1, . . . , Rn, where the second parallel n-bit address signal is generated at a timing of the refresh main signal, where the bits A0 . . . A(N−1) of the first parallel n-bit address signal are respectively output as the bits Rn . . . R(n−(N−1)) of the second n-bit address signal, and where the bits A(N) . . . An of the first n-bit address signal are respectively output as the bits R0 . . . R(n−(N−2)) of the second n-bit parallel signal. A row decoder of the memory device addresses a word line of the memory array according to the second n-bit parallel signal at a timing of the refresh main signal.

According to another aspect of the present invention, a method is provided of refreshing a semiconductor memory device having a plurality of memory blocks and at least one word line in each of the plurality of memory blocks, the memory device operable in a full capacity memory mode in which all the memory block are used, and a least one reduced capacity memory mode in which less than all the memory blocks are used. The method includes generating a multi-bit address signal having a logic value which is incremented by 1 during each of successive refresh periods, selecting at least one memory block to be refreshed according to at least one least significant bit of the multi-bit address signal, selecting at least one word line within the selected memory block according to remaining bits of the multi-bit address signal, and refreshing the selected word line of the selected memory block in the full capacity mode and each of the at least one reduced capacity memory modes.

According to still another aspect of the present invention, a method is provided of refreshing a semiconductor memory device having a plurality of memory blocks and at least one word line in each of the plurality of memory blocks, the memory operable in a full capacity memory mode in which all the memory block are used, and a least one reduced capacity memory mode in which less than all the memory blocks are used. The method includes generating a refresh reference signal pulse, and, responsive to the refresh reference signal pulse, non-sequentially selecting the word lines during successive refresh operations in at least the full capacity mode, and non-sequentially selecting the word lines during successive refresh operations in at least one reduced capacity memory mode.

According to yet another aspect of the present invention, a method is provided of refreshing a semiconductor memory device operable in a full memory capacity mode and N reduced memory capacity modes, where N is an integer of 1 or more, the memory device including a memory array comprising m memory blocks each having at least one word line, where m is an integer of $2^N$ or more. The method includes generating a refresh reference signal pulse having a period T, generating a first n-bit address signal having bits A0, A1, . . . , An, where n is an integer greater than or equal to N, and where a logic value of the n-bit address signal is sequentially incremented by 1 at each period T of the refresh reference pulse signal. The method further includes generating a refresh main signal according to a mode control signal and bits A0 . . . A(N−1) of the first address signal, and generating a second n-bit address signal having bits R0, R1, . . . , Rn, where the second parallel n-bit address signal is generated at a timing of the refresh main signal, where the bits A0 . . . A(N−1) of the first parallel n-bit address signal are respectively output as the bits Rn . . . R(n−(N−1)) of the second n-bit address signal, and where the bits A(N) . . . An of the first n-bit address signal are respectively output as the bits R0 . . . R(n−(N−2)) of the second n-bit parallel signal. A word line of the memory array is addressed according to the second n-bit parallel signal at a timing of the refresh main signal.

BRIEF DESCRIPTION OF THE DRAWINGS

The various features and advantages of the present invention will become readily apparent from the detailed description that follows, with reference to the accompanying drawings, in which:

FIG. 13 is a timing diagram of a memory device of an embodiment of the present invention changing from a half memory mode to a full memory mode.

DETAILED DESCRIPTION OF THE PREFERRED EMBODIMENTS

The present invention will now be described in detail with reference to several non-limiting preferred embodiments.

A semiconductor memory device according to one non-limiting embodiment of the present invention will be described with reference to FIGS. 3, 4 and 5. This embodiment is capable of selectively operating in one of four memory modes, i.e., a full memory mode, a half (½) memory mode, a quarter (¼) memory mode, and an eighth (⅛) memory mode.

Figure 3:
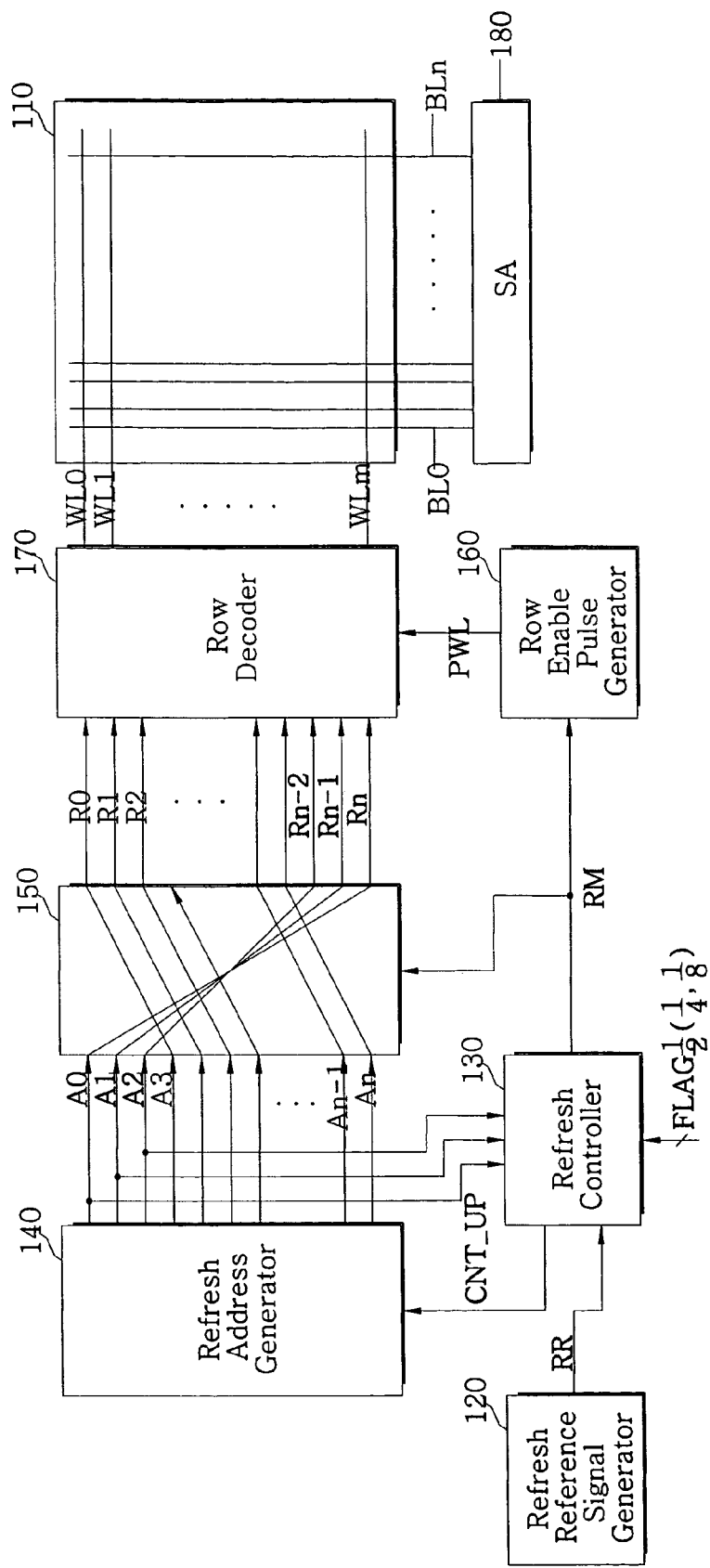
FIG. 3 is a block diagram of a semiconductor memory device according to an embodiment of the present invention.
Figure 4:
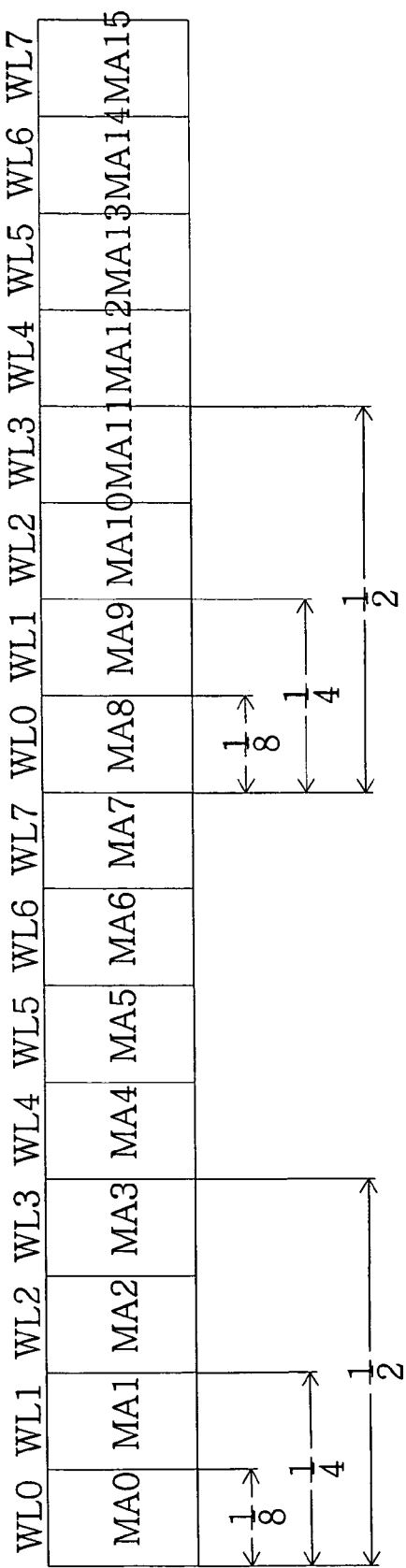
FIG. 4 depicts a memory block configuration according to an embodiment of the present invention.

As shown, the memory device of FIG. 3 includes a memory array 110, refresh reference signal generator circuit 120, a refresh controller 130, a refresh address generator circuit 140, an address sorter circuit 150, a row enable pulse generator circuit 160, a row decoder circuit 170, and a sense amplifier (SA) circuit 180.

The memory array 110 is connected to a plurality of bit lines BL0–BLn, which in turn are connected to the sense amplifier 180. Further, as schematically illustrated in FIG. 4, the memory array 110 of this example is divided into sixteen (16) memory blocks MA0–MA15. At least one of a plurality of word lines WL0–WLm is connected to each of the memory blocks MA0–MA15. In this example, WL0 is connected to memory blocks MA0 and MA8, WL1 is connected to memory blocks MA1 and MA9, WL2 is connected to memory blocks MA2 and MA10, WL3 is connected to memory blocks MA3 and MA11, WL4 is connected to memory blocks MA4 and MA12, WL5 is connected to memory blocks MA5 and MA13, WL6 is connected to memory blocks MA6 and MA14, and WL7 is connected to memory blocks MA7 and MA15.

In a full memory mode, all of the memory blocks MA0–MA15 are utilized, and accordingly, all of the word lines WL0–WL7 are used in a refresh operation. In a half memory mode, half of the memory blocks MA0–MA3 and MA8–MA11 are utilized, and word lines WL0–WL3 are used in the refresh operation. In a quarter memory mode, a quarter of the memory blocks MA0–MA1 and MA8–MA9 are utilized, and word lines WL1 and WL2 are used in the refresh operation. Finally, in an eighth memory mode, one eighth of the memory blocks MA0 and MA8 are utilized, and the word line WL0 is used in the refresh operation.

The refresh reference signal generator 120 generates a refresh reference signal RR which is applied to the refresh controller 130. In this example, the refresh controller 130 may be implemented by a counter or oscillator, and the refresh reference signal RR is as a sort of constant clock signal having a fixed period regardless of the memory mode of the device. However, as one skilled in the art will appreciate, the period of the refresh reference signal RR may optionally be varied in accordance with the memory mode of the device.

In addition to the refresh reference signal RR, the refresh controller 130 receives the three least significant bits A0, A1 and A2 among the address signal bits A0–An output by the refresh address generator 140. Further, the refresh controller 130 receives a mode settings flag signals (FLAG_1/2, FLAG_1/4, and FLAG$_{FLAG}$_1/8), and outputs a count-up signal CNT_UP and a refresh main signal RM. As will be explained in more detail later, when the flag signals FLAG_1/2, FLAG_1/4, and FLAG_1/8 are all inactive, the refresh controller 130 outputs a refresh main signal RM which is the same as the refresh reference signal RR irrespective of refresh address signals A0–A2. On the other hand, when any one of the flag signals FLAG$_{FLAG}$_1/2, FLAG$_{FLAG}$_1/4, and FLAG$_{FLAG}$_1/8 is active, the refresh controller 130 masks a given interval of the refresh reference signal RR according to the address signals A0–A2, where the given interval is set according to which of the flag signals FLAG$_{FLAG}$_1/2, FLAG$_{FLAG}$_1/4, and FLAG$_{FLAG}$_1/8 is active. In contrast, the count-up signal CNT_UP is continuously generated regardless of the states of the address signals A0–A2 and the flag signals.

Figure 5:
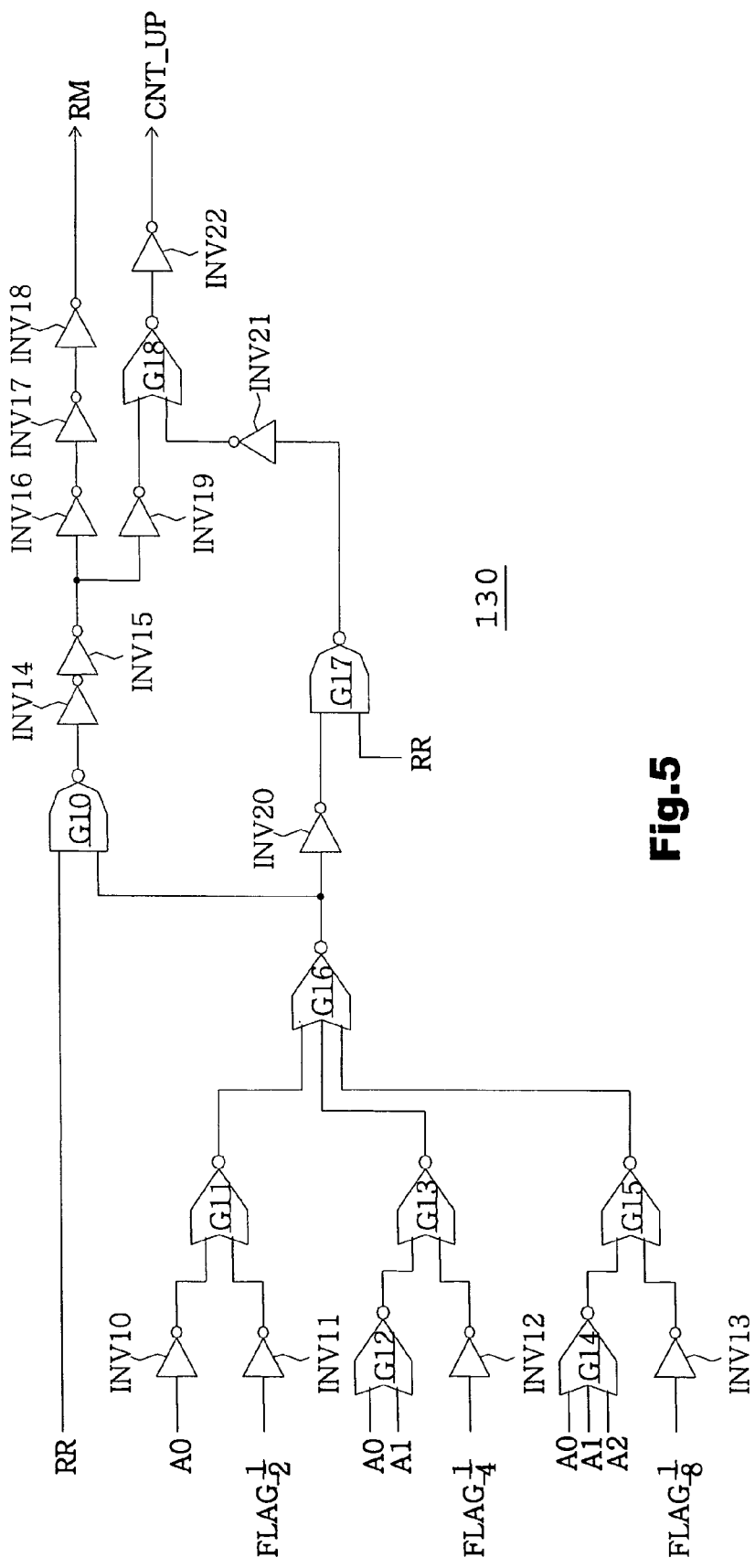
FIG. 5 is a circuit diagram of a refresh controller according to an embodiment of the present invention.

An example of the refresh controller 130 is illustrated in the circuit diagram of FIG. 5. As with all other embodiments disclosed herein, the invention is not limited to the specific example of FIG. 5.

The refresh controller 130 receives the flag signals FLAG$_{FLAG}$_1/2, FLAG$_{FLAG}$_1/4 and FLAG$_{FLAG}$_1/8, the refresh reference signal RR, and the refresh address signals A0–A2. Further, the refresh controller is composed of inverters INV10–INV22, NOR gates G11–G16 and G18, and NAND gates G10 and G17 all connected as shown in FIG. 5.

When the memory device is operating in a full memory mode, flag signals FLAG$_{FLAG}$_1/2, FLAG$_{FLAG}$_1/4, and FLAG$_{FLAG}$_1/8 are all set to LOW. As a result, the output signals of the NOR gates G11, G13, and G15 all become LOW irrespective of the logic states of address signals A0, A1, and A2. As the output signals of the NOR gates G11, G13, and G15 are all LOW, the output of the NOR gate G16 goes HIGH. Thus, when the flag signals FLAG$_{FLAG}$_1/2, FLAG$_{FLAG}$_1/4, and FLAG$_{FLAG}$_1/8 are all LOW, the refresh main signal RM maintains the same logic level as the refresh reference signal RR. Likewise, since the output signal of the NOR gate G16 is HIGH, the count-up signal CNT_UP is maintained in the same logic state as the refresh reference signal RR via the output of the inverter INV15.

When the memory device is operating in a half memory mode, the flag signal FLAG$_{FLAG}$_1/2 is HIGH and the flag signals FLAG$_{FLAG}$_1/4 and FLAG$_{FLAG}$_1/8 are LOW. Since the flag signals FLAG$_{FLAG}$_1/4 and FLAG$_{FLAG}$_1/8 are LOW, the outputs of the NOR gates G13 and G15 remain LOW regardless of the logic states of the address signals A0, A1 and A2. Since the flag signal FLAG$_{FLAG}$_1/2 is HIGH, the output of the NOR gate G11 depends on the logic state of the address signal A0. When the address signal A0 is LOW, the output of the NOR gate G11 goes LOW, and when the address signal A0 is HIGH, the output of the NOR gate G11 goes HIGH. Thus, when the address signal A0 is LOW, the output of the NOR gate G16 is HIGH, and the signals CNT_UP and RM take on the same logic levels as the refresh reference signal RR as described above in connection with the full memory mode operation. On the other hand, when the address signal A0 is HIGH, the NOR gate G16 output becomes LOW, and accordingly, the output of the NAND gate G10 is HIGH regardless of the refresh reference signal RR. In this manner, the refresh main signal RM is held LOW (i.e., the refresh reference signal RR is masked) when the address signal A0 is HIGH. In the meantime, when the output signal of the NOR gate G16 is LOW, the count-up signal CNT_UP is maintained in the same logic state as the refresh reference signal RR via the output of the inverter INV21.

When the memory device is operating in a quarter memory mode, the flag signal FLAG$_{FLAG}$_1/4 is HIGH and the flag signals FLAG$_{FLAG}$_1/2 and FLAG$_{FLAG}$_1/8 are LOW. Since the flag signals FLAG$_{FLAG}$_1/2 and FLAG$_{FLAG}$_1/8 are LOW, the outputs of NOR gates G11 and G15 are low regardless of the logic states of address signals A0, A1 and A2. Since the flag signal FLAG$_{FLAG}$_1/4 is HIGH, the output NOR gate G16 is determined by the logic states of address signals A0 and A1. When both address signals A0 and A1 are LOW, the output of the NOR gate G16 is HIGH, and the signals CNT_UP and RM take on the same logic levels as the refresh reference signal RR as described above in connection with the full memory mode operation. On the other hand, when one or both of the address signals A0 and A1 is HIGH, the NOR gate G16 output becomes LOW, and the NAND gate G10 output is HIGH regardless of the refresh reference signal RR. In this manner, the refresh main signal RM is held LOW (i.e., the refresh reference signal RR is masked) when either one of the address signals A0 and A1 is HIGH. In the meantime, when the output signal of the NOR gate G16 is LOW, the count-up signal CNT_UP is maintained in the same logic state as the refresh reference signal RR via the output of the inverter INV21.

When the memory device is operating in the eighth memory mode, the flag signal $FLAG_{FLAG}$_1/8 is HIGH and the flag signals $FLAG_{FLAG}$_1/2 and $FLAG_{FLAG}$_1/4 are LOW. Since the flag signals $FLAG_{FLAG}$_1/2 and $FLAG_{FLAG}$_1/4 are LOW, the outputs of the NOR gates G11 and G13 are LOW regardless of the logic states of the address signals A0, A1 and A3. Since the flag signal $FLAG_{FLAG}$_1/4 is HIGH, the output NOR gate G16 is determined by the logic states of address signals A0, A1 and A2. When all of the address signals A0, A1 and A2 are LOW, the output of the NOR gate G16 is HIGH, and the signals CNT_UP and RM take on the same logic levels as the refresh reference signal RR as described above in connection with the full memory mode operation. On the other hand, when one or more of the address signals A0, A1 and A2 is HIGH, the NOR gate G16 output becomes LOW, and the NAND gate G10 output is HIGH regardless of the refresh reference signal RR. In this manner, the refresh main signal RM is held LOW (i.e., the refresh reference signal RR is masked) when one of the address signals A0, A1 and A2 is HIGH. In the meantime, when the output signal of the NOR gate G16 is LOW, the count-up signal CNT_UP is maintained in the same logic state as the refresh reference signal RR via the output of the inverter INV21.

The logical operation of the circuit of FIG. 5 is summarized in TABLE A below (where the symbol "*" means HIGH (H) or LOW (L)).

TABLE A

| Mode | Flags | A0 | A1 | A2 | Operation (in all cases, CNT_UP is the same as RR) |
|---|---|---|---|---|---|
| Full | FLAG_1/2 = L<br>FLAG_1/4 = L<br>FLAG_1/4 = L | * | * | * | RM is the same as RR |
| HALF | FLAG_1/2 = H<br>FLAG_1/4 = L<br>FLAG_1/4 = L | L | * | * | RM is the same as RR |
| HALF | FLAG_1/2 = H<br>FLAG_1/4 = L<br>FLAG_1/4 = L | H | * | * | RM is masked |
| 1/4 | FLAG_1/2 = L<br>FLAG_1/4 = H<br>FLAG_1/4 = L | L | L | * | RM is the same as RR |
| 1/4 | FLAG_1/2 = L<br>FLAG_1/4 = H<br>FLAG_1/4 = L | H | * | * | RM is masked |
| 1/4 | FLAG_1/2 = L<br>FLAG_1/4 = H<br>FLAG_1/4 = L | * | H | * | RM is masked |
| 1/8 | FLAG_1/2 = L<br>FLAG_1/4 = L<br>FLAG_1/4 = H | L | L | L | RM is the same as RR |
| 1/8 | FLAG_1/2 = L<br>FLAG_1/4 = L<br>FLAG_1/4 = H | H | * | * | RM is masked |
| 1/8 | FLAG_1/2 = L<br>FLAG_1/4 = L<br>FLAG_1/4 = H | * | H | * | RM is masked |
| 1/8 | FLAG_1/2 = L<br>FLAG_1/4 = L<br>FLAG_1/4 = H | * | * | H | RM is masked |

The refresh address generator 140 sequentially outputs the refresh address signal A0–An, and increments the logic value represented by the bits A0–An in response to the count-up signal CNT_UP. For example, the refresh address generator may output a new incremented refresh address signal A0–An at each rising transition of the count-up signal CNT_UP.

The sorter circuit 150 converts the refresh address signal A0–An into a row address signal R0–Rn in response to the refresh main signal RM becoming active. In particular, in this example, the sorter circuit 150 rearranges the bits of the refresh address signal such that least significant bits A0–A2 are respectively output as row address bits Rn, Rn-1 and Rn-2, and the remaining bits A3–An are respectively output as row address bits R0 to Rn-3. As will be explained in more detail later, the refresh address bits A0–An (row address bits Rn, Rn-1, and Rn-2) are utilized for the selection of memory blocks, and the remaining refresh address bits A3–An (row address bits R0 to Rn-3) are utilized in the selection of word lines.

The row enable pulse generator circuit 160 generates a row enable pulse signal PWL in response to the refresh main signal RM. For example, the row enable pulse generator circuit 160 may generate an active row enable pulse signal PWL of a given pulse width whenever the refresh main signal RM becomes active.

The row decoder circuit 170 operates when the row enable pulse signal PWL is active. The row decoder circuit 170 selects memory blocks in response to row address signals Rn-2, Rn-1, and Rn, and selects a word line of the selected memory block in response to row address signals R0 to Rn-3. Memory cells in a selected/activated word line are refreshed by the sense amplifier circuit 180 in a well-known manner.

Figure 6:
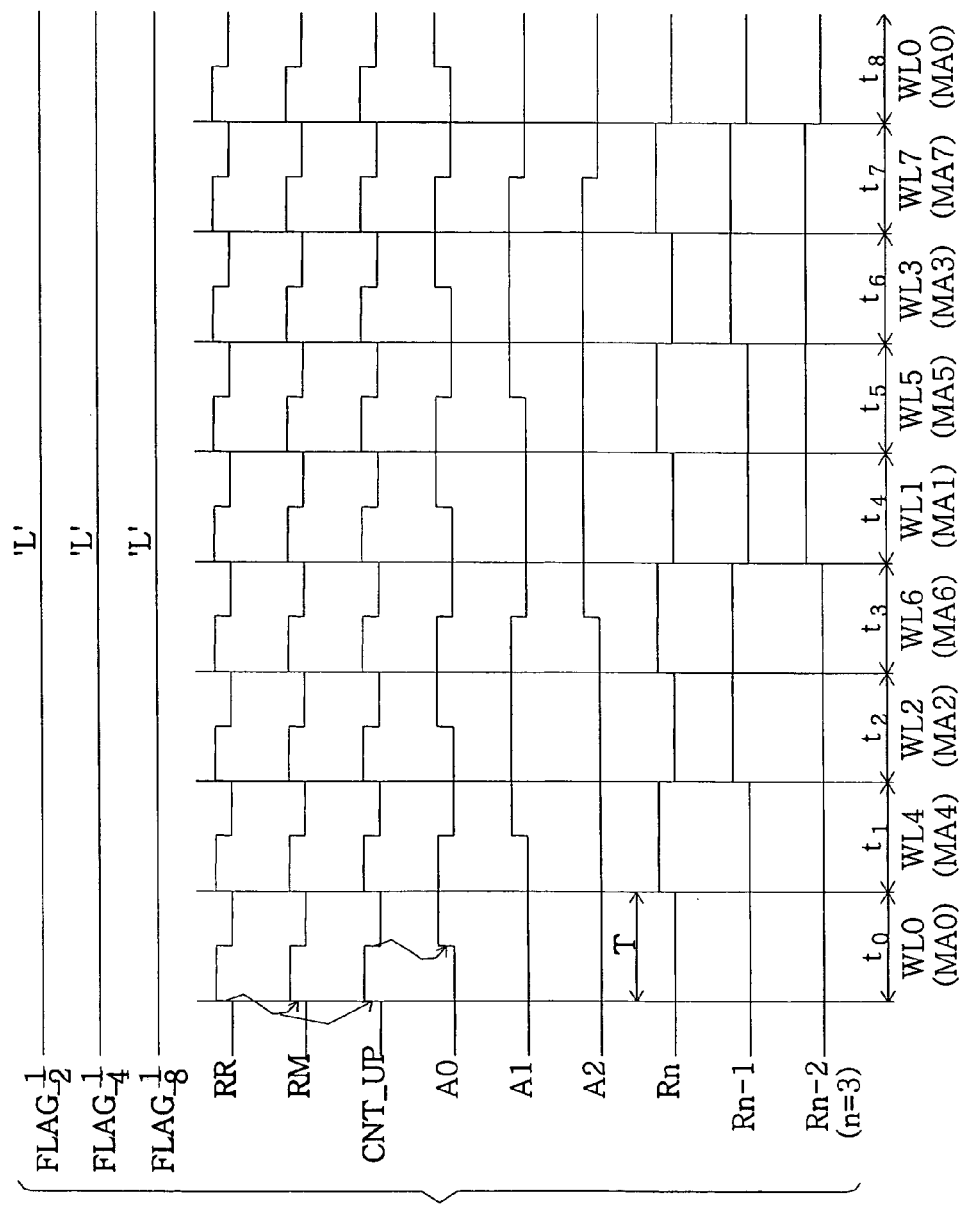
FIG. 6 is a timing diagram of a memory device operating in a full memory mode according to an embodiment of the present invention.
Figure 7:
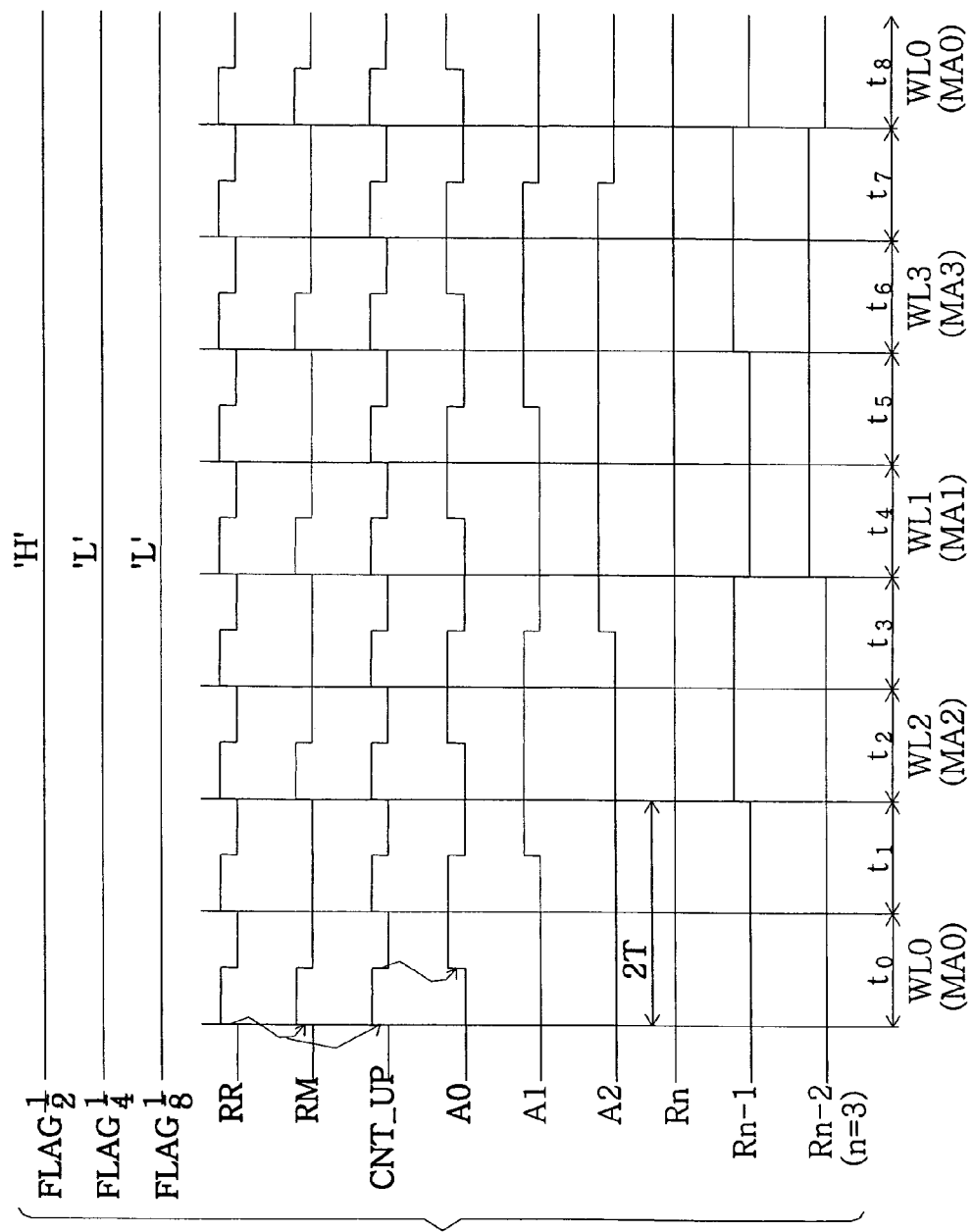
FIG. 7 is a timing diagram of a memory device operating in a half (½) memory mode according to an embodiment of the present invention.
Figure 8:
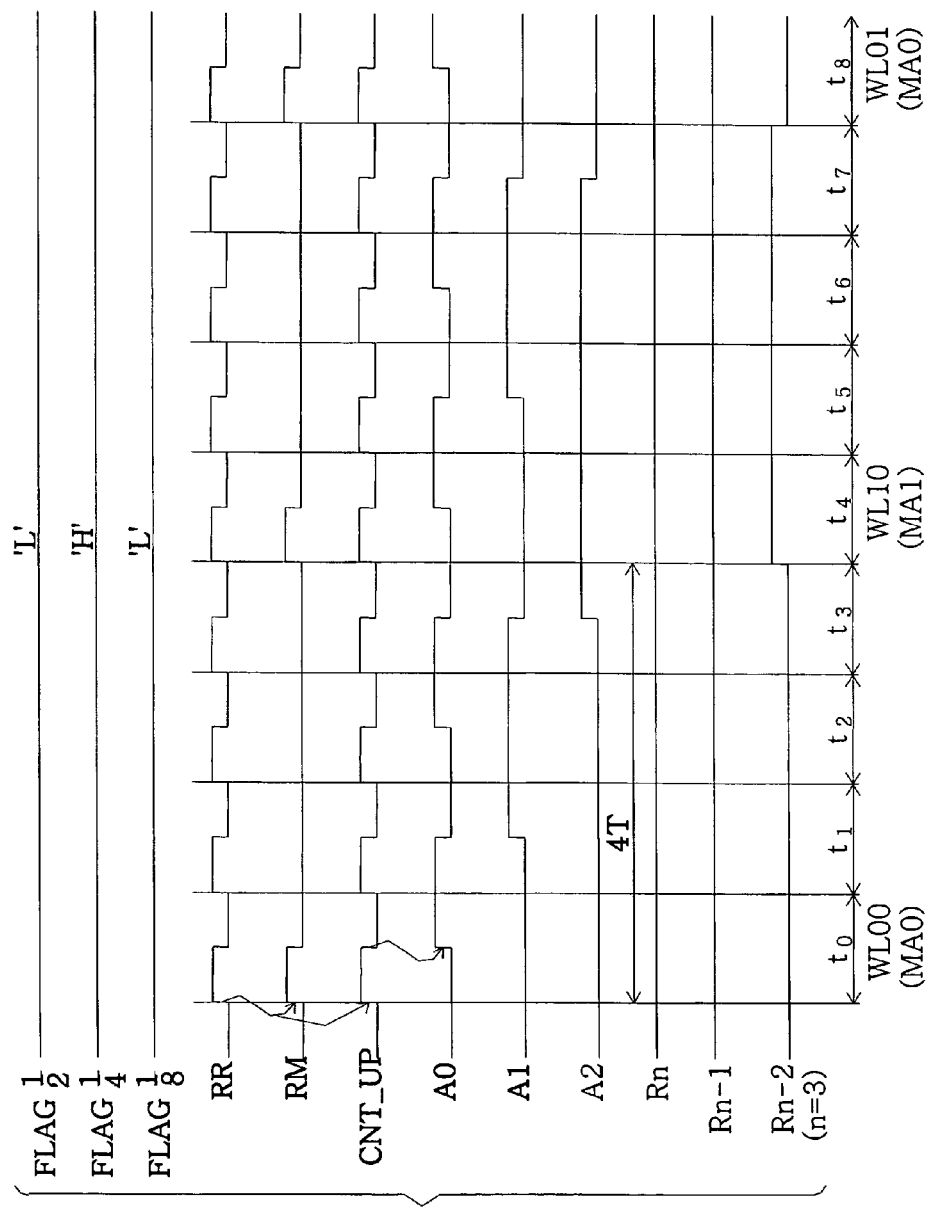
FIG. 8 is a timing diagram of a memory device operating in a quarter (¼) memory mode according to an embodiment of the present invention.
Figure 9:
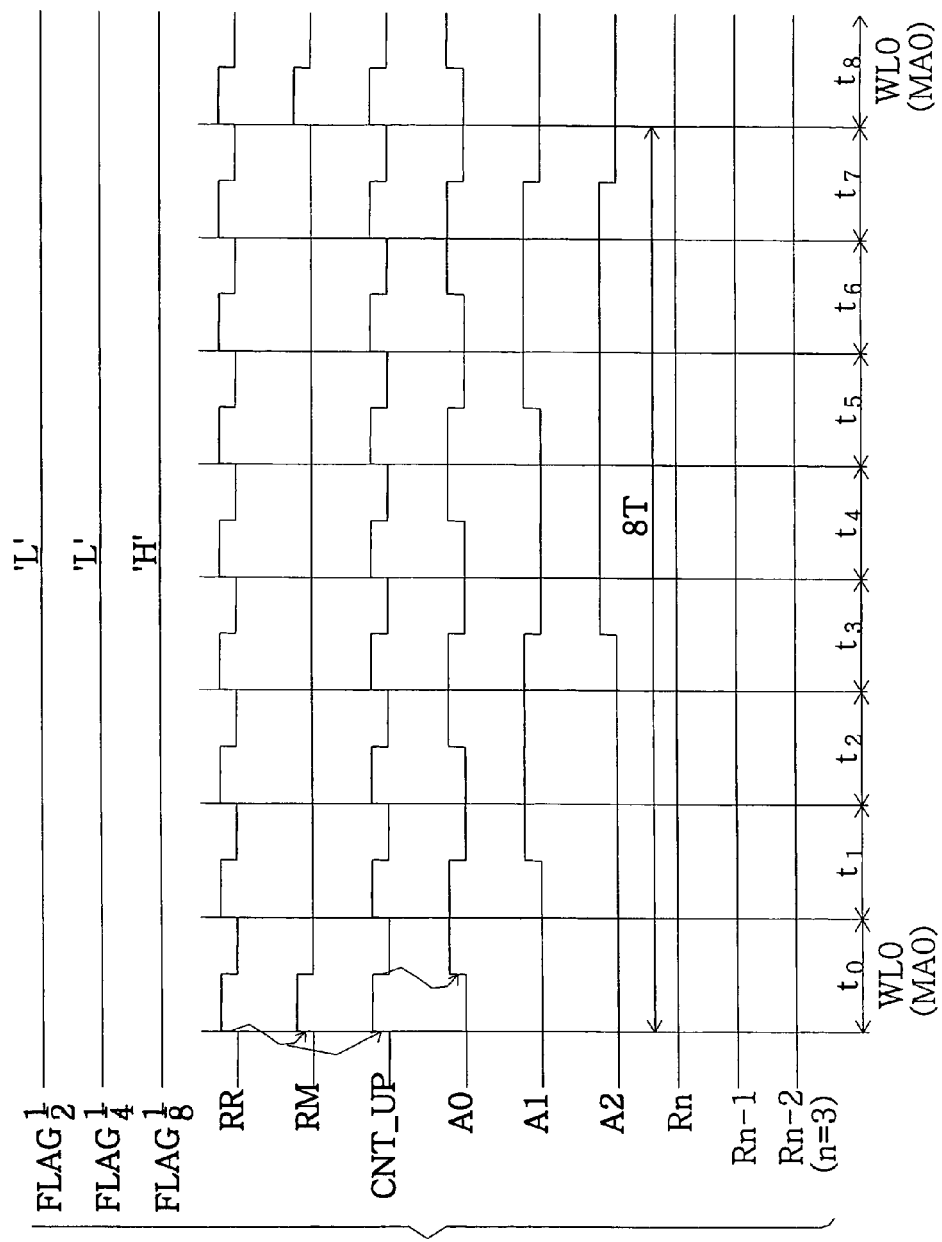
FIG. 9 is a timing diagram of a memory device operating in an eighth (⅛) memory mode according to an embodiment of the present invention.

The refresh operation of the semiconductor memory device of FIGS. 3 through 5 will now be described with further reference to the timing diagrams of FIGS. 6-9. FIG. 6 is a timing diagram of the memory device operating in a full memory mode; FIG. 7 is a timing diagram of the memory device operating in a half (½) memory mode; FIG. 8 is a timing diagram of the memory device operating in a quarter (¼) memory mode; and FIG. 9 is a timing diagram of the memory device operating in an eighth (⅛) memory mode.

In the example that follows, two word lines are simultaneously activated in a refresh operation, and two memory blocks are selected at the same time. For example, referring to FIG. 3, memory blocks MAi and MAj (i=0–7, j=8–15) are simultaneously selected, and word lines (e.g. WL0) of selected memory blocks (e.g. MA0 and MA8) placed at the same position are activated at the same time. For the convenience of description, a refresh operation will be described with reference to memory blocks MA0–MA7 and under the assumption that two word lines are arranged in each of the eight memory blocks MA0–MA7. With this assumption, three row address signals are required to select memory blocks MA0–MA7, and word lines in a selected memory block are selected by means of one row address signal. Accordingly, in this exemplary embodiment, a four-bit refresh address is used.

In the explanation that follows, two word lines are arranged in each memory block. However, as would be readily apparent to one skilled in the art, more than two words lines can be arranged in each memory block.

Turning to FIG. 6, the full memory mode is shown, and accordingly flag signals $FLAG_{FLAG}$_1/2, $FLAG_{FLAG}$_1/4, and $FLAG_{FLAG}$_1/8 are LOW. In this mode, all of the memory blocks MA0–MA7 are used. Assuming that output signals A0–A3 of the refresh address generator circuit 140 are '0', the NOR gate G16 becomes HIGH. As illustrated in FIG. 6, in a period $t_0$, the refresh reference signal RR transitions from LOW to HIGH. As the NOR gate G16 is HIGH, the refresh main signal RM transitions from LOW to HIGH together with refresh reference signal RR. At the same time, a count-up signal CNT_UP transitions from LOW to HIGH. An address sorter circuit 150 transfers an output of a refresh address generator circuit 140 to a row decoder circuit 170 in response to the LOW to HIGH transition of the refresh main signal RM. At this time, least significant refresh address signals bits A0–A2 are used as row address signals R3–R1 for selecting memory blocks, and a remaining refresh address signal A0 is used as a row address signal R0 for selecting word lines of a selected memory block. Since the row address signals R3–R1 are '000', a memory block MA0 is selected by the row decoder circuit 170. Since a row address signal A0 is '0', a word line WL0 of the memory block MA0 is selected by the row decoder circuit 170. As described above, the row decoder circuit 170 operates only upon activation of a row enable pulse signal PWL. This means that the row decoder circuit 170 operates only when the refresh main signal RM is active.

Next, as the refresh reference signal RR transitions from a HIGH to LOW in the period $t_0$, the refresh main signal RM and the count-up signal CNT_UP also transition from HIGH to LOW. The refresh address generator circuit 140 increments a refresh address A0–A3 by '1' in synchronization with the HIGH to LOW transition of the count-up signal CNT_UP. As such, a logic value of the refresh reference signal A0 is changed from '0' to '1', and the row address signals R3–R1 for selecting memory blocks in a next period become '100'. At this time, the row address signal R0 for selecting a word line of a selected memory block remains unchanged.

In a period $t_1$, the refresh reference signal RR transitions from LOW to HIGH. Accordingly, the refresh main signal RM and the count-up signal CNT_UP also transition from LOW to HIGH. The address sorter circuit 150 transfers an output of the refresh address generator circuit 140 to the row decoder circuit 170 in response to LOW to HIGH transition of the refresh main signal RM. As illustrated in FIG. 6, since the row address signals R3–R1 are '100', a memory block MA4 is selected. Also, since the row address signal R0 is '0', a word line WL4 in the selected memory block MA4 is selected.

The refresh address generator circuit 140 increments a refresh address A0–A3 by '1' in synchronization with a HIGH to LOW transition of the count-up signal CNT_UP. As the refresh address is increased by '1', a value of the refresh reference signal A0 is changed from '1' to '0' and a value of the refresh reference signal A1 is changed from '0' to '1'. Thus, row address signals R3–R1 for selecting memory blocks in a next period become '010'. The row address signal R0 for selecting a word line of a selected memory block remains unchanged.

In a period $t_2$, the refresh reference signal RR transitions from LOW to HIGH. Accordingly, the refresh main signal RM and the count-up signal CNT_UP also transition from LOW to HIGH. The address sorter circuit 150 transfers an output of the refresh address generator circuit 140 to the row decoder circuit 170 in response to the LOW to HIGH transition of the refresh main signal RM. Since the row address signals R3–R1 are '010', a memory block MA2 is selected. Also, since the row address signal R0 is still '0', a word line WL2 in the selected memory block MA2 is selected.

As is apparent from the above description, an address is sequentially incremented by '1' whenever a refresh reference signal RR transitions from HIGH to LOW. This means that subsequent row address signals R3–R1 are varied in the order of '110', '001', 101', '011', and '111' during the time periods $t_3$ through $t_8$. Accordingly, memory blocks are selected in the order of MA6, MA1, MA5, MA3, and MA7. In selected memory blocks, word lines at the same position are selected because the row address signal R0 is '0'.

In full memory mode illustrated in FIG. 6, word lines are selected in the order of WL0, WL4, WL2, WL6, WL1, WL5, WL3, and WL7. All memory blocks MA0–MA7 are selected in a corresponding order until all word lines are selected.

Reference is now made to FIG. 7, in which the half memory mode is shown, and accordingly, flag signal $FLAG_{FLAG\_1/2}$ is HIGH, and flag signals $FLAG_{FLAG\_1/4}$ and $FLAG_{FLAG\_1/8}$ are LOW. In this mode, the memory blocks MA0–MA3 are used. As described previously, since the flag signal $FLAG_{FLAG\_1/2}$ is HIGH, the output signal of a NOR gate G16 (FIG. 5) is determined by the logic state of the address signal A0. That is, when the address signal A0 is '0', the NOR gate G16 output is HIGH.

In this example, the address signals A0–A3 output by the refresh address generator circuit 140 are all '0' at the beginning of time period $t_0$. Since the output of the NOR gate G16 is HIGH, the refresh main signal RM transitions from LOW to HIGH when the refresh reference signal RR transitions from LOW to HIGH. At the same time, a count-up signal CNT_UP also transitions from LOW to HIGH. During time period $t_0$, the address sorter circuit 150 transfers an output of the refresh address generator circuit 140 to the row decoder circuit 170 in response to the LOW to HIGH transition of the refresh main signal RM. At this time, lower refresh address signals A0–A2 are selected as row address signals R3–R1 for selecting memory blocks, and a remaining refresh address signal A0 is selected as a row address signal R0 for selecting word lines of a selected memory block. Since row address signals R3–R1 are '000', a memory block MA0 is selected by the row decoder circuit 170. Since a row address signal A0 is '0', a word line WL0 of the memory block MA0 is selected by the row decoder circuit 170.

Next, the period $t_0$, the refresh address generator circuit 140 increments the refresh address A0–A3 by '1' in synchronization with a HIGH to LOW transition of the count-up signal CNT_UP. Accordingly, the logic state of the refresh reference signal A0 is changed from '0' to '1'. As such, the output of the NOR gate G16 (FIG. 5) becomes LOW, and the refresh reference signal RR is masked as described previously. Therefore, as illustrated in FIG. 7, the refresh main signal RM remains LOW in a time period $t_1$. As a result, the refresh address generated in the time period $t_0$ is not transferred to the row decoder circuit 170 and a row enable pulse signal is not generated. That is, the row decoder circuit 170 is inactive. This means that a word line is not selected during the time period $t_1$. Also, during the time period $t_1$, the count-up signal CNT_UP transitions from HIGH to LOW in synchronization with a transition of the refresh reference signal RR. The refresh address A0–A3 is therefore incremented by '1' to become '0100'.

In the manner described above, as illustrated in FIG. 7, memory blocks MA2, MA1, and MA3 are subsequently selected in time periods $t_2$, $t_4$, and $t_6$ periods respectively, while no memory blocks are not selected in time periods $t_3$, $t_5$, and $t_7$.

That is, in refresh operation of the half memory mode, word lines are selected in the order of WL0, WL2, WL1 and WL3, and the memory blocks MA0–MA3 are selected in a corresponding order.

FIG. 8 is a refresh timing diagram of the memory device operating in a quarter (¼) memory mode, and FIG. 9 is a refresh timing diagram of the memory device operating in an eighth (⅛) memory mode. A detailed description of FIGS. 8 and 9 is omitted here, since the relationships between the illustrated waveforms and the circuitry of FIGS. 3 and 5 should be readily apparent from the detailed description above in connection with FIGS. 6 and 7.

In the refresh operation of the quarter memory mode shown in FIG. 8, word lines are selected in the order of WL0 and WL1, and the memory blocks MA0–MA1 are selected in a corresponding order. In the refresh operation of the eighth memory mode shown in FIG. 9, only word line WL0 is selected, and the corresponding memory block MA0 is selected.

Figure 10:
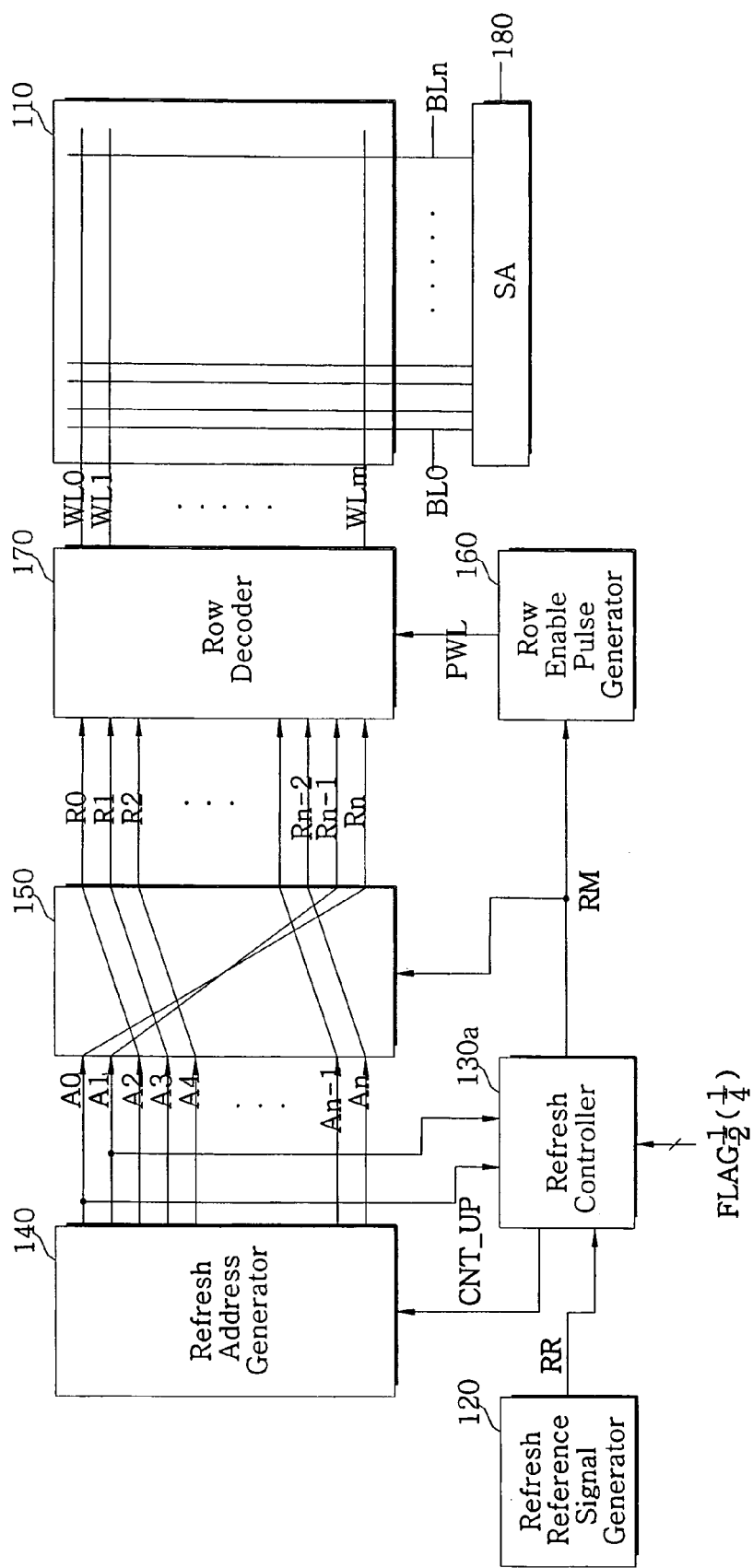
FIG. 10 is a block diagram of a semiconductor memory device according to another embodiment of the present invention.

FIG. 10 depicts a memory device of an alternative embodiment which is capable of switching between full, half and quarter memory modes. The configuration of FIG. 10 operates essentially in the same manner as the above-described configuration of FIG. 3, except that only two of refresh address bits A0 and A1 are applied to the refresh controller 130a, and these same two address bits A0 and A1 are output as row address signals Rn and Rn-1 by the address sorter 150a. The configuration of FIG. 10 operates in a full memory mode when flag signals $FLAG_{FLAG\_1/2}$ and $FLAG_{FLAG\_1/4}$ are both LOW, in a half memory mode when flag signal $FLAG_{FLAG\_1/2}$ is HIGH, and a quarter memory mode when flag signal $FLAG_{FLAG\_1/4}$ is HIGH.

Figure 11:
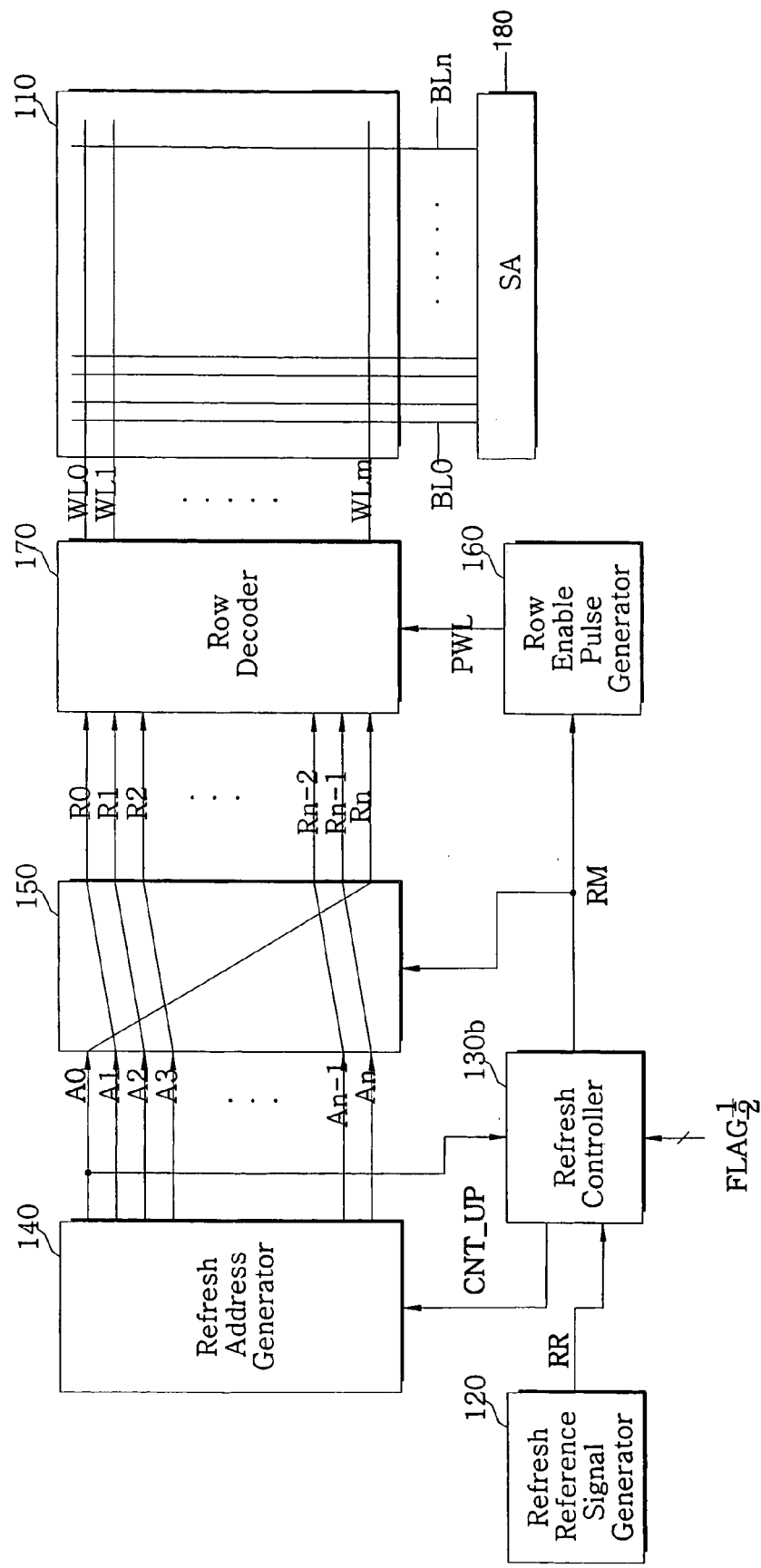
FIG. 11 is a block diagram of a semiconductor memory device according to yet another embodiment of the present invention.

FIG. 11 depicts a memory device of another alternative embodiment which is capable of switching between full and half memory modes. The configuration of FIG. 11 operates essentially in the same manner as the above-described configuration of FIG. 3, except that only one refresh address bits A0 is applied to the refresh controller 130b, and this same address bit A0 is output as row address signal Rn by the address sorter 150b. The configuration of FIG. 11 operates in a full memory mode when the flag signal $FLAG_{FLAG\_1/2}$ is LOW, and in a half memory mode when the flag signal $FLAG_{FLAG\_1/2}$ is HIGH.

As described previously with reference to FIGS. 1 and 2, the conventional memory device suffers a drawback in that certain memory blocks may loss data when transitioning between memory size modes. This is because the word lines of some memory blocks may not be selected/activated within a preferred refresh cycle time needed to securely retain data.

In contrast, according to embodiments of the present invention, when transitioning between memory size modes, the refresh cycle time any given memory block is maintained at the preferred value. This is explained below with reference to FIGS. 12 and 13.

As mentioned above, in the full memory mode, the selection order of the word lines is non-sequential, i.e., WL0, WL4, WL2, WL6, WL1, WL5, WL3, WL7. This is illustrated on the left side of the vertical line extending through the timing chart of FIG. 12, where the eight illustrated waveforms respectively represent the eight possible instances in which the memory device is switched to the half memory mode. In the half memory mode shown to the right of the vertical line, the selection order of the word lines is also non-sequential, i.e., WL0, WL2, WL1, WL3.

Figure 12:
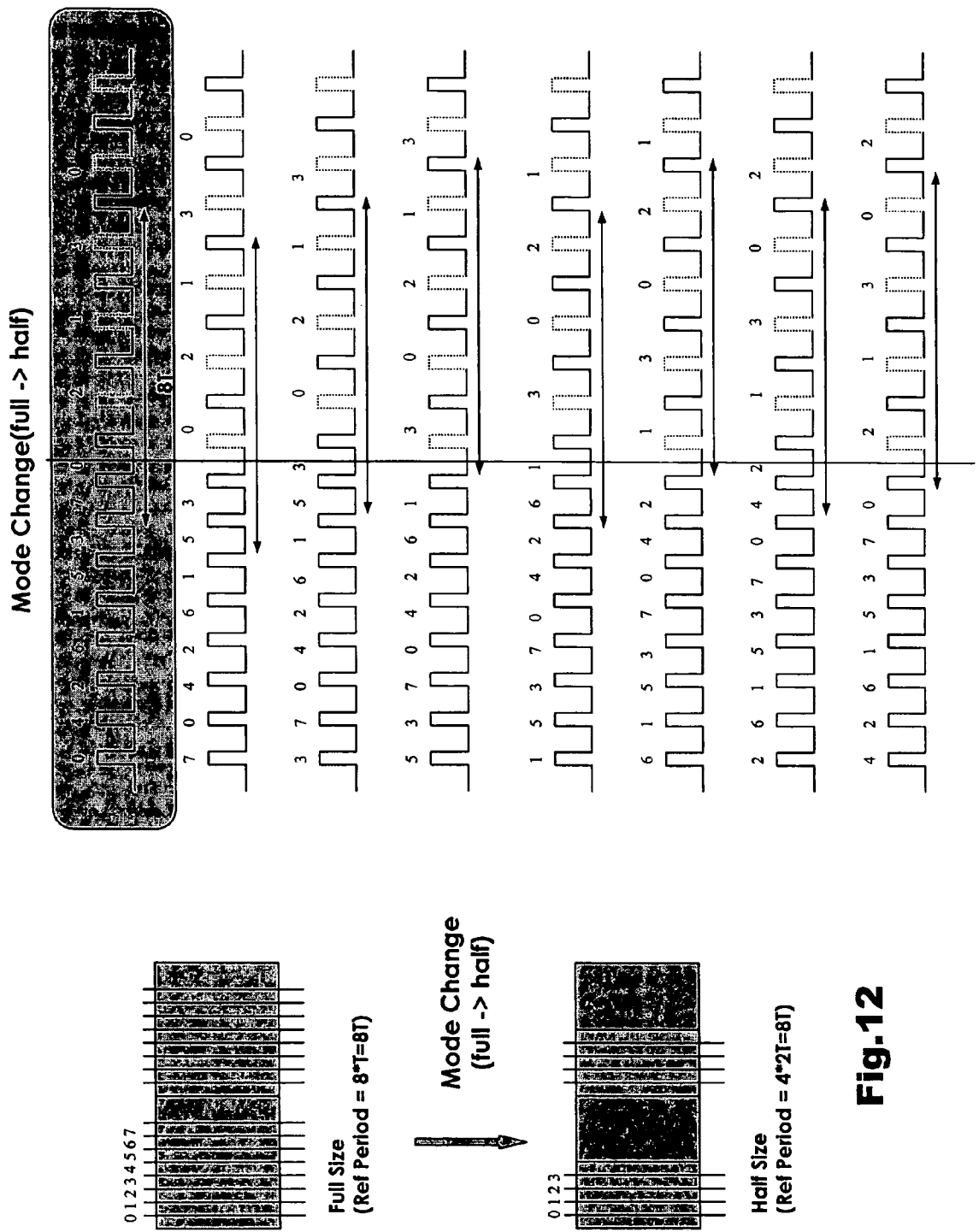
FIG. 12 is a timing diagram of a memory device of an embodiment of the present invention changing from a full memory mode to a half memory mode.

As shown in FIG. 12, due to the non-sequential selection order of the word lines in the full and half memory modes, the refresh cycle time never exceeds 8T when switching to the half memory mode. This is true regardless of when the memory device is switched to the half memory mode.

FIG. 13 is similar to FIG. 12, except that the switching of the memory device from half memory mode to full memory mode is shown. Again, due to the non-sequential selection order of the word lines in the half and full memory modes, the refresh cycle time never exceeds 8T when switching to the full memory mode. As before, this is true regardless of when the memory device is switched to the half memory mode.

Figure 1:
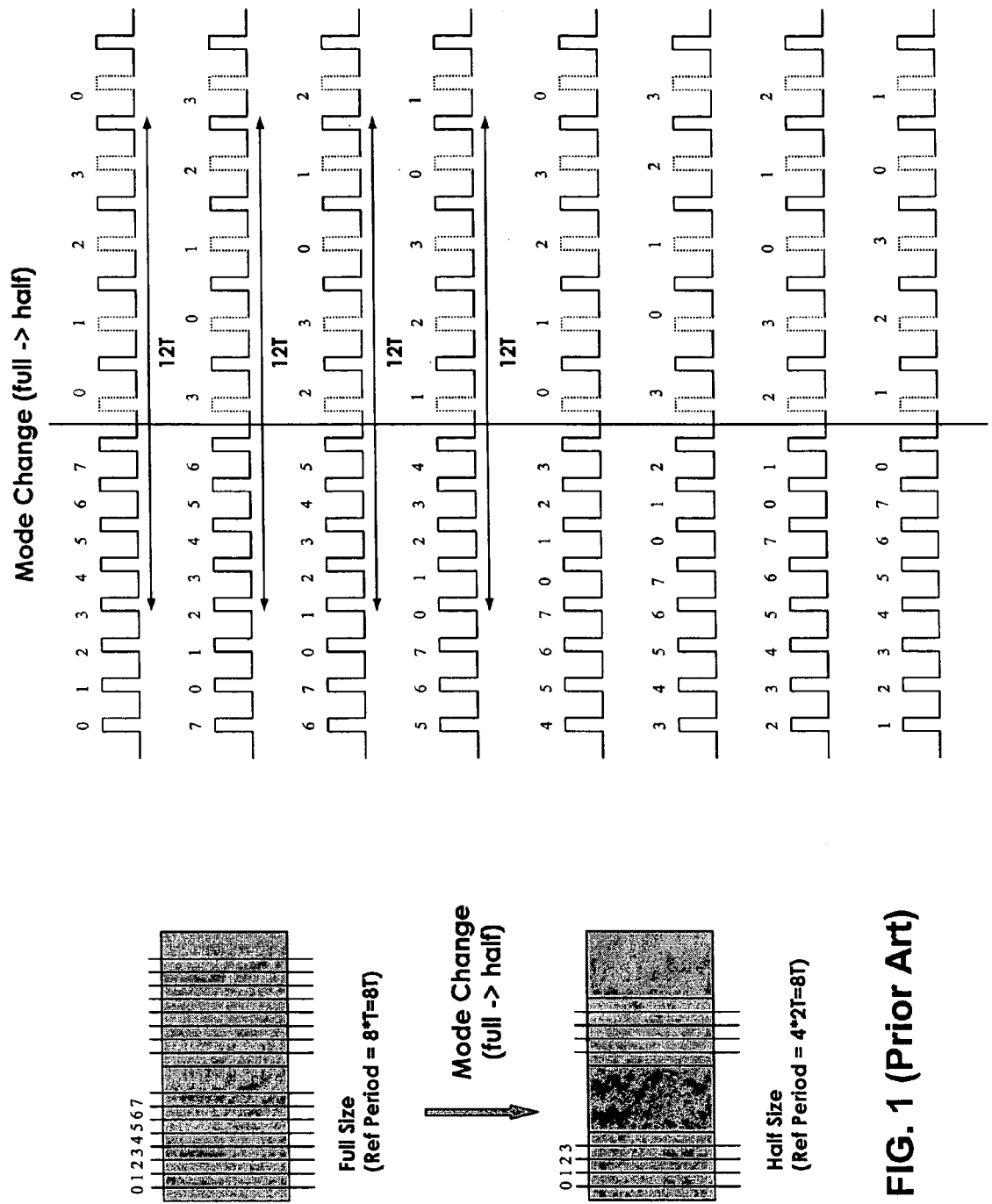
FIG. 1 is a timing diagram of a conventional memory device changing from a full memory mode to a half memory mode.
Figure 2:
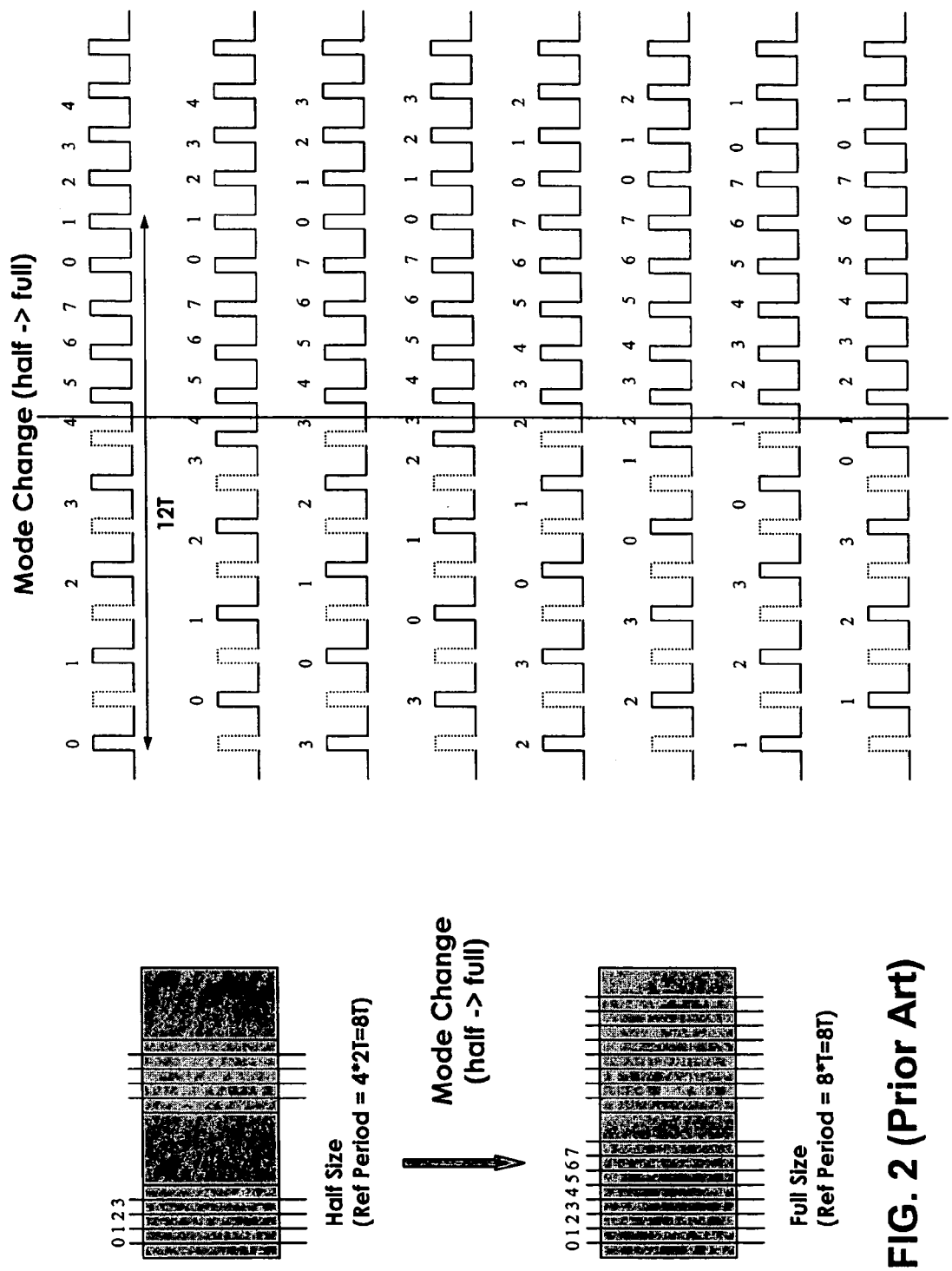
FIG. 2 is a timing diagram of a conventional memory device changing from a half memory mode to a full memory mode.

In both of FIG. 12 and FIG. 13, the mode change-over takes place more quickly in some instances then in the conventional memory device (contrast FIGS. 1 and 2). This is because in the embodiments of the present invention, the change of memory mode is timed with the generation of a new address signal A0, which always toggles at interval T regardless of the memory mode. For example, suppose that WL7 is refreshed (which means that A0 is HIGH) and then the memory mode is changed from full mode to half mode. After a time period of T, the refresh address A0 goes to LOW and WL0 is refreshed. After another time period of T time, A0 goes to HIGH so WL4 is not refreshed.

In the drawings and specification, there have been disclosed typical preferred embodiments of this invention and, although specific examples are set forth, they are used in a generic and descriptive sense only and not for purposes of limitation. It should therefore be understood the scope of the present invention is to be construed by the appended claims, and not by the exemplary embodiments.

What is claimed is:

1. A memory device operable in a full memory capacity mode and at least one reduced memory capacity mode, said memory device comprising:
    a memory array including a plurality of word lines;
    a refresh reference signal generator which generates a refresh reference signal pulse; and
    a row selection circuit, responsive to the refresh reference signal pulse, which non-sequentially selects the word lines during successive refresh operations in at least the full capacity mode.

2. The memory device of claim 1, wherein the row selections circuit non-sequentially selects the word lines during successive refresh operations in at least one reduced capacity memory mode.

3. The memory device of claim 1, wherein the row selection circuit comprises an address sorting circuit which rearranges parallel bits of a first row address signal which sequentially designates the word lines to obtain a second row address signal which non-sequentially designates the word lines.

4. The memory of claim 1, wherein the memory device is a DRAM device.

5. The memory device of claim 1, wherein the memory device is a UtRAM.

6. A semiconductor memory device comprising:
    a memory array having a plurality of memory blocks, each of memory blocks having at least one word line; and
    a refresh circuit which is operable in a full memory mode and a reduced memory mode, wherein the refresh circuit applies a refresh signal to the all of word lines during each of successive constant refresh cycle times in the full memory mode, and wherein the refresh circuit applies the refresh signal to a subset of the word lines during each of the successive constant refresh cycle times in the reduce memory mode;
    wherein, during each transition from the full memory mode to the reduced memory mode, all of the subset of the word lines receive the refresh signal within the constant refresh cycle time.

7. The semiconductor memory device of claim 6, wherein, during each transition from the reduced memory mode to the full memory mode, all of the word lines receive the refresh signal within the constant refresh cycle time.

8. The semiconductor memory device of claim 7, wherein the refresh circuit non-sequentially applies the refresh signal to the word lines in the full memory mode, and non-sequentially applies the refresh signal to the subset of word lines in the reduced memory mode.

9. The semiconductor memory of claim 6, wherein the memory device is a DRAM device.

10. The semiconductor memory device of claim 6, wherein the memory device is a UtRAM.

11. A semiconductor memory device which is operable in a full capacity mode and at least one reduced capacity mode, said device comprising:
a memory array comprising a plurality of memory blocks, each of the memory blocks having at least one word line;
an address generation circuit which generates a first multi-bit address signal having a logic value which is sequentially incremented by one during each of successive refresh periods;
an address sorting circuit which receives the first multi-bit address signal and outputs a second multi-bit address signal in which one or more least significant bits of the first multi-bit address signal are arranged in the second multi-bit address signal to indicate a memory block of the memory array, and in which remaining bits of the first multi-bit address signal are arranged in the second multi-bit address to indicate a word line within the selected memory block;
a row decoder which receives the second multi-bit address signal and which selects at least one word line according to the second multi-bit address during a refresh operation.

12. The semiconductor memory device of claim 11, wherein the device is operable in N reduce memory capacity modes and the memory array comprises $2^N$ memory blocks, where N is an integer of 1 or more.

13. The semiconductor memory device of claim 12, wherein the address sorting circuit arranges the N least significant bits of the first multi-bit address signal as the N most significant bits of the second multi-bit address signal.

14. The semiconductor memory device of claim 13, wherein a total refresh cycle time during the full capacity memory mode and each reduced memory capacity mode is one times or a multiple of (N+1)*T, where T is the refresh period.

15. The semiconductor memory device of claim 14, wherein the row decoder selects at least one word line according to the second multi-bit address during each successive refresh period T in the full capacity mode, and wherein the row decoder selects at least one word line according to the second multi-bit address signal during each successive multiple of the refresh period T during the reduced capacity memory mode.

16. The semiconductor memory device of claim 15, wherein the at least one reduced capacity memory mode includes a one-half capacity memory mode, and wherein the row decoder selects at least one word line according to the second multi-bit address signal during each successive refresh period 2*T during the one-half capacity memory mode.

17. The semiconductor memory device of claim 16, wherein the at least one reduced capacity memory mode includes a one-quarter capacity memory mode, and wherein the row decoder selects at least one word line according to the second multi-bit address signal during each successive refresh period 4*T during the one-quarter capacity memory mode.

18. The semiconductor memory device of claim 17, wherein the at least one reduced capacity memory mode includes a one-eighth capacity memory mode, and wherein the row decoder selects at least one word line according to the second multi-bit address signal during each successive refresh period 8*T during the one-eighth capacity memory mode.

19. The semiconductor memory device of claim 16, wherein N=1, wherein the first multi-bit address signal has bits A0 . . . An, and the second multi-bit address signal has bits R0 . . . Rn, where n is an integer of 1 or more, and
wherein the address sorting circuit arranges the bit A0 of the first multi-bit address signal as the bit Rn of the second multi-bit address signal, and the bits A1 . . . An of the first multi-bit address signal as the respective bits R0 . . . Rn-1 of the second multi-bit address signal.

20. The semiconductor memory device of claim 17, wherein N=2, wherein the first multi-bit address signal has bits A0 . . . An, and the second multi-bit address signal has bits R0 . . . Rn, where n is an integer of 2 or more, and
wherein the address sorting circuit arranges the bits A0 and A1 of the first multi-bit address signal as the respective bits Rn and Rn-l of the second multi-bit address signal, and the bits A2 . . . An of the first multi-bit address signal as the respective bits R0 . . . Rn-2 of the second multi-bit address signal.

21. The semiconductor memory device of claim 18, wherein N=3, wherein the first multi-bit address signal has bits A0 . . . An, and the second multi-bit address signal has bits R0 . . . Rn, where n is an integer of 3 or more, and
wherein the address sorting circuit arranges the bits A0, A1 and A2 of the first multi-bit address signal as the respective bits Rn, Rn-1 and Rn-2 of the second multi-bit address signal, and the bits A3 . . . An of the first multi-bit address signal as the respective bits R0 . . . Rn-3 of the second multi-bit address signal.

22. The semiconductor memory of claim 11, wherein the memory device is a DRAM device.

23. The semiconductor memory device of claim 11, wherein the memory device is a UtRAM.

24. A memory device operable in a full memory capacity mode and N reduced memory capacity modes, where N is an integer of 1 or more, said memory device comprising:
a memory array comprising m memory blocks each having at least one word line, where m is an integer $2^N$ or more;
a refresh reference signal generator which generates a refresh reference signal pulse having a period T;
an refresh address generation circuit which generates a first n-bit address signal having bits A0, A1, . . . , An, wherein n is an integer greater than or equal to N, and wherein a logic value of the n-bit address signal is sequentially incremented by 1 at each period T of the refresh reference pulse signal;
a refresh controller which generates a refresh main signal according to a mode control signal and bits A0 . . . A(N-1) of the first address signal;
an address converter which generates a second n-bit address signal having bits R0, R1, . . . , Rn, wherein the second parallel n-bit address signal is generated at a timing of the refresh main signal, wherein the bits A0 ... A(N−1) of the first parallel n-bit address signal are respectively output as the bits Rn ... R(n−(N−1)) of the second n-bit address signal, and wherein the bits A(N) ... An of the first n-bit address signal are respectively output as the bits R0 ... R(n−(N−2)) of the second n-bit parallel signal; and a row decoder which addresses a word line of the memory array according to the second n-bit parallel signal at a timing of the refresh main signal.

25. The memory device of claim 24, wherein a total refresh cycle time during the full capacity memory mode and each reduced memory capacity mode is one times or a multiple of (N+1)*T.

26. The memory device of claim 24, wherein the at least one reduced capacity memory mode includes a one-half capacity memory mode, wherein the refresh main signal has a period 2*T during the one-half capacity memory mode, and wherein the row decoder selects at least one word line according to the second multi-bit address signal during each successive period 2*T during the one-half capacity memory mode.

27. The memory device of claim 24, wherein the at least one reduced capacity memory mode includes a one-quarter capacity memory mode, wherein the refresh main signal has a period 4*T during the one-quarter capacity memory mode, and wherein the row decoder selects at least one word line according to the second multi-bit address signal during each successive period 4*T during the one-quarter capacity memory mode.

28. The memory device of claim 24, wherein the at least one reduced capacity memory mode includes a one-eighth capacity memory mode, wherein the refresh main signal has a period 8*T during the one-eighth capacity memory mode, and wherein the row decoder selects at least one word line according to the second multi-bit address signal during each successive period 8*T during the one-eighth capacity memory mode.

29. The memory device of claim 26, wherein N=1 such that address converter arranges the bit A0 of the first multi-bit address signal as the bit Rn of the second multi-bit address signal, and the bits A1 ... An of the first multi-bit address signal as the respective bits R0 ... Rn-1 of the second multi-bit address signal.

30. The memory device of claim 27, wherein N=2 such that the address sorting circuit arranges the bits A0 and A1 of the first multi-bit address signal as the respective bits Rn and Rn-1 of the second multi-bit address signal, and the bits A2 ... An of the first multi-bit address signal as the respective bits R0 ... Rn-2 of the second multi-bit address signal.

31. The memory device of claim 28, wherein N=3 such the address converter arranges the bits A0, A1 and A2 of the first multi-bit address signal as the respective bits Rn, Rn-1 and Rn-2 of the second multi-bit address signal, and the bits A3 ... An of the first multi-bit address signal as the respective bits R0 ... Rn-3 of the second multi-bit address signal.

32. The memory of claim 24, wherein the memory device is a DRAM device.

33. The memory device of claim 24, wherein the memory device is a UtRAM.

* * * * *